United States Patent [19]

Crewe

[11] Patent Number: 4,725,736
[45] Date of Patent: Feb. 16, 1988

[54] ELECTROSTATIC ELECTRON GUN WITH INTEGRATED ELECTRON BEAM DEFLECTION AND/OR STIGMATING SYSTEM

[75] Inventor: Albert V. Crewe, Palos Park, Ill.

[73] Assignee: Electron Beam Memories, Palo Alto, Calif.

[21] Appl. No.: 895,200

[22] Filed: Aug. 11, 1986

[51] Int. Cl.[4] ............................. H01J 3/18; H01J 3/32
[52] U.S. Cl. ..................... 250/396 R; 250/396 ML; 250/423 R; 365/118; 369/101
[58] Field of Search ....... 250/396 R, 396 ML, 423 R; 365/118, 237, 217, 128, 126; 369/101

[56] References Cited

U.S. PATENT DOCUMENTS

| Re. 30,974 | 6/1982 | DeMoss et al. | 369/44 |
|---|---|---|---|
| 3,100,260 | 8/1963 | Wilska | 250/396 |
| 3,150,258 | 9/1964 | Wilska | 250/396 |
| 3,253,144 | 5/1966 | Rempfer | 250/396 |
| 3,350,503 | 10/1967 | Gregg | 178/6.6 |
| 3,527,943 | 9/1970 | Paidosh | 250/65 |
| 3,737,589 | 6/1973 | Redlich et al. | 179/100.3 |
| 3,952,146 | 4/1976 | Plows et al. | 178/6.6 |
| 3,978,338 | 8/1976 | Ueno et al. | 250/396 |
| 4,001,493 | 1/1977 | Cone | 358/127 |
| 4,090,077 | 5/1978 | Anger | 250/396 R |
| 4,101,813 | 7/1978 | Parker et al. | 315/370 |
| 4,303,864 | 12/1981 | Crewe et al. | 250/396 |
| 4,427,886 | 1/1984 | Martin et al. | 250/310 |
| 4,516,026 | 5/1985 | Jouffrey et al. | 250/310 |
| 4,629,899 | 12/1986 | Plies | 250/396 ML |

FOREIGN PATENT DOCUMENTS

| 57-69653 | 4/1982 | Japan | 250/396 R |
|---|---|---|---|
| 58-5952 | 1/1983 | Japan | 250/396 R |
| 9160947 | 9/1984 | Japan | 250/396 R |

OTHER PUBLICATIONS

A High Resolution Scanning Transmission Electron Microscope, A. V. Crewe, Jour. App. Phys., vol. 39, No. 13, 5861–68, Dec., 1968.

Primary Examiner—Carolyn E. Fields
Assistant Examiner—John A. Miller

[57] ABSTRACT

An ultra-compact electrostatic electron gun includes integrated beam-modifying means for use in electron beam memory systems, electron microscopes, electron lithographic devices and the like. The gun is illustrated as comprising means forming a point source of electrons and means receiving electrons from the point source for defining an electron beam. Electrostatic lens means receives the beam and forms a beam focus. An integrated magnetic field-generating means establishes a field of magnetic flux through the electrostatic lens for modifying the position, cross-sectional shape or other characteristic of the beam. The magnetic field-generating means is adapted to receive static or dynamic control signals and is characterized by comprising means positioned axially coincident with and surrounding the electrostatic lens to effectively immerse substantially the entire lens in the beam-modifying magnetic field, whereby due to the axial coincidence of the magnetic field-generating means with the lens, a characteristic of the electron beam may be modified without the magnetic field-generating adding significantly, if at all, to the axial length of the gun.

18 Claims, 11 Drawing Figures

ELECTROSTATIC ELECTRON GUN WITH INTEGRATED ELECTRON BEAM DEFLECTION AND/OR STIGMATING SYSTEM

CROSS REFERENCE TO RELATED APPLICATIONS

This application is related to, but in no way dependent upon, my copending applications Ser. No. 825,219, filed Feb. 3, 1986, Ser. No. 909,015, filed Sept. 18, 1986, Ser. No. 895,199, filed Aug. 11, 1986, and Ser. No. 895,202, filed Aug. 11, 1986.

BACKGROUND OF THE INVENTION

It is a primary object of the invention described and claimed in my copending application Ser. No. 895,199 to provide an electron beam memory system having for the first time an electrostatic gun capable of developing high enough electron probe current densities to permit no-develop recording and small enough proble diameters to permit ultra-high density recording and yet of such low mass and compactness as to make feasible rapid random accessing of any area on the system's recording medium.

There is a need in such systems for dynamic beam deflection or positioning means in order to provide the very fine beam position adjustments required for track selection and tracking. There also exists a need for stigmating means for removing cross-sectional asymmetries in the electron beam.

To achieve the low head access times targeted, the electrostatic gun described and claimed in my copending application Ser. No. 895,199, is disclosed as having an axial length of 0.5–1.0 centimeter or less and a mass of 20 grams or less.

In the context of such a system, a deflection and/or stigmatizing system is needed which is ultra-compact and of ultra-low mass.

Beam deflection and/or stigmating systems are known which comprise deflection and/or stigmating coils wound on a mandril or otherwise supported between the gun exit and a beam focus. Other systems are known in which plural foci are formed in the beam path and the deflection and/or stigmating system is located intermediate two of such foci. Such systems are commonly provided in electron beam systems wherein the focus is formed so close to the exit point from the electron gun as to not permit the use of conventional beam deflection and/or stigmatizing means.

In each of such systems, the deflection and/or stigmatizing coils and coil mounting structures add to the mass of the beam generating system. Such conventional deflection and/or stigmatizing systems are deemed to be unacceptably large and massive for a fast-access electron beam memory system of the type identified above.

In electron guns or electron beam devices of the type having a beam deflection and/or stigmating system located intermediate two foci, the gun or head itself is much too long and massive to have any applicability to the fast-access electron beam memory system of the type described.

To the end of achieving the desired high electron probe density and small probe size, the above-identified ultra-compact electrostatic electron gun may provide a magnification of the electron source of 0.5 to 2.0. Image distances may be in the order of only a few millimeters. No conventional deflection or deflection/stigmating system is known of the type located between the gun exit plane and the beam's focus, which is compact enough to fit within this extremely small space.

Aside from electron beam memory applications, there is a need for a system capable of modifying an electron beam, as by dynamically or statically deflecting it and/or stigmating it, or otherwise, which can be integrated with an electrode gun to provide the beam modifying without adding to the axial length of the gun assembly.

PRIOR ART

U.S. Pat. Nos. 4,303,864, 4,101,813, 3,350,503, 3,527,943, Re. 30,974, 3,952,146, 3,737,589, 4,001,493, 3,978,338, 4,427,886, 4,516,026.

A High Resolution Scanning Transmission Electron Microscope, A. V. Crewe, Jour. App. Phys., Vol. 39, No. 13, 5861–68, Dec., 1968.

OBJECTS OF THE INVENTION

It is an object of this invention to provide an ultracompact electrostatic electron gun with integrated beam modifying means for use in electron beam memory systems, electron microscopes, electron lithographic devices and the like.

It is another object of this invention to the need for axially compact and low mass means capable of providing static or dynamic beam deflection or positioning and/or beam stigmatizing in a variety of electron beam devices such as scanning electron microscopes, scanning transmission electron microscopes, electron beam recording and retrieval systems of various types, electron beam lithographic devices and the like.

It is another object to provide such a gun with integrated beam modifying means wherein the beam modifying means does not add significantly, if at all, to the axial length of the gun.

It is still another object to provide such integrated beam modifying means which may take the form of magnetic coils for producing beam deflection fields for dynamically or statically deflecting the beam,, or alternatively, may be stigmating coils for creating stigmating fields for adjusting the cross-sectional configuration of an electron beam.

It is another object of this invention to provide for use in a fast-access electron beam memory system a deflection or a deflection/stigmating system which is axially compact and adds very little mass to the system's electron beam generating means.

DESCRIPTION OF THE PREFERRED EMBODIMENT

The electron gun according to the present invention has numerous uses in applications requiring or desiring ultracompactness, extremely low mass and a relatively high current density. The most promising application envisioned is in an electron beam memory system.

Figure 1:
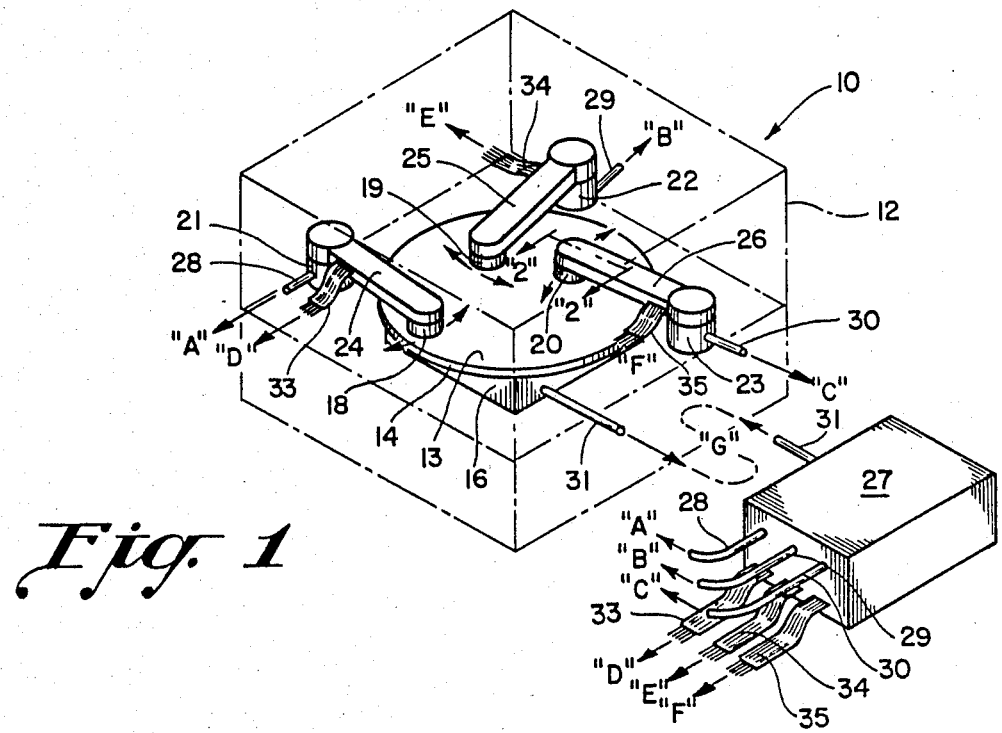
FIG. 1 is a highly schematic illustration of an electron beam memory system constructed according to the teachings of the present invention like-lettered arrows identify common conductors.

FIG. 1 is a schematic view of an electron beam memory system 10 embodying the present invention. The FIG. 1 system 10 is shown as including a vacuum enclosure, depicted schematically in dotted line form at 12. Within the enclosure is a storage medium 13 supported on a rotatable disc 14. The disc 14 is rotated by a disc drive shown schematically at 16.

The electron beam memory system 10 includes a plurality of electron beam heads adapted for simultaneous operation. In the illustrated embodiment, I have shown three heads—a writing head 18 containing an electron gun for recording information, a verification head 19 containing an electron gun for verifying the fact and integrity of the stored information, and a reading head 20 containing an electron gun for retrieving the stored information.

The electron beam memory system 10 is illustrated schematically as including head drives 21, 22, 23 interconnected with the heads 18, 19, 20 by support arms 24, 25, 26 for moving the heads 18, 19, 20 across the disc 14.

Auxiliary electronic and electrical apparatus, shown schematically at 27, provides the necessary drive signals through conductors 28, 29, 30 for energizing head drives 21, 22, 23. Apparatus 27 also supplies through conductor 31 suitable drive signals for the disc drive 16, as well as the necessary heater current for the field emission source heater and energization potentials for the gun electrodes through bundles of conductors 33, 34, 35.

Figure 2:
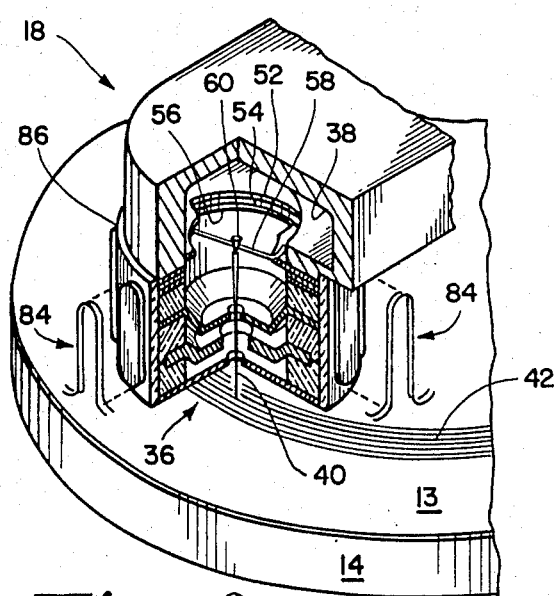
FIG. 2 is a perspective, partly sectioned view of a head constituting part of the FIG. 1 system and containing a writing or reading electron gun implementing an aspect of the present invention.
Figure 3:
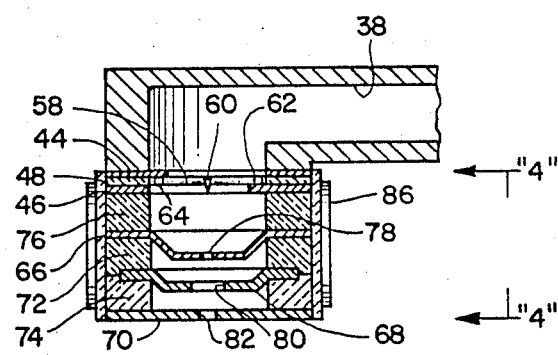
FIG. 3 is a fragmentary sectioned side elevational view of the electron beam memory system head and electron gun shown in FIG. 2.
Figure 4:
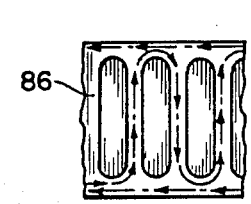
FIG. 4 is a diagram illustrating the manner in which integrated deflecting and/or stigmating coils are wound on a mandril constituting parts of the FIGS. 2–3 gun.

FIGS. 2-3 illustrate an electron gun 36 constituting part of writing head 18 and described and claimed in my referent copending application Ser. No. 895,199. The FIG. 2 gun is capable of developing a finely focused electron beam probe at high beam current densities, yet is ultra-compact and of extremely low mass. For the first time, the electron gun of the aforesaid invention makes possible a truly random accessed electron beam memory system for high rate, ultra-high density electron beam data recording, and yet with recording power making possible no-develop recording, i.e., recording without the need for developing the recording medium after exposure.

An electron beam head/gun assembly embodying this invention is illustrated in FIGS. 2-3 as including a vacuum manifold 38. Electron gun assembly 36 is appended to the vacuum manifold 38 and develops an extremely fine electron beam probe 40 of sufficiently great current density to write (record) tracks 42 on the storage medium 13 on disc 14.

The electron gun assembly 36 comprises an extremely axially compact structure, all components of the gun being optimized for axial compactness and minimization of mass.

As will be described, the series of structures making up the electron gun assembly 36 are all essentially ring-like elements of metal or ceramic adapted to be brazed together by well-known techniques to make an extremely rugged and hermetically sealed structure.

The electron gun with which this invention is used preferably utilizes a field emission cathode, however, for certain applications not requiring maximum beam current or minimum probe size, other high brightness sources such as heated lanthanum hexaboride may be employed.

The field emission cathode assembly shown in FIGS. 2-3 is described and claimed in my copending application Ser. No. 895,202. The field emission cathode assembly comprises two metal rings 44, 46 between which is sandwiched a ceramic ring 48. The metal rings 44, 46 and ceramic ring 48 define circular apertures 52, 54 and 56 respectively. The rings 44, 46 are brazed to the ceramic ring; the metal ring 44 is welded to the vacuum manifold 38 to form a rigid hermetically sealed assembly.

A filament 58 extends substantially diagonally across the apertures 52, 54, 56 formed in the rings 44, 46, 48 and has welded medially thereof a field emission tip 60. The tip 60 is aligned on the electron optical axis of the gun. When excited by an appropriate electrical potential, the tip 60 produces an extremely small and intensely bright source of electrons.

The metal rings 44, 46 serve as expedient terminals for the application of filament heating currents for use in applications wherein the field emitter is heated. The out-turned ends 62, 64 of the filament 58 are welded to the rings 44 and 46, respectively, from which rings the filament may derive a source of appropriate electrical potential for extracting electrons from the tip 60. The use of rings 44, 46 as terminals for the application of heater currents has a decided advantage over bringing wire leads in through the enclosure for the field emitter. They provide a mechanically rugged, hermetically sealed assembly and, of equal importance, large area terminals which serve to dissipate heater current heat over a large terminal area, and thus minimizing concern for failures of the terminals due to overheating. The use of a filament extending diagonally across the openings, rather than the common "hairpin" filament, has the further advantage of being less susceptible to vibration.

The electron gun assembly 36 further includes an electrostatic focus lens for forming a real image of the electron source produced at the field emission source in the vincinity of the recording medium 13. An electrostatic lens is illustrated as comprising a first electrode 66, a second electrode 68 and a third electrode 70. The first and second electrodes are dished-disc electrodes. The third electrode is a flat-disc electrode. The electrodes are spaced from each other by ceramic insulators 72, 74. The electrodes are spaced from the field emission cathode assembly by a ceramic insulator 76. The electrodes 66, 68 and 70 and the insulators 72, 74 and 76 are brazed together to define a mechanically sound, hermetically sealed assembly.

The field emitter is adapted to receive a predetermined first electrical potential effective to form a high brightness electron source at the tip 60. The first electrode 66 is adapted to receive a predetermined second electrode electrical potential which is positive relative to the potential on the tip 60 and has a value effective to extract electrons from the tip 60. The first electrode 60 has a very small aperture 78 for determining the diameter of the electron beam which is formed.

The second electrode 68 is adapted to receive an adjustable third, focusing, electrical potential which is negative relative to the aforesaid second potential applied to the first electrode 66. The second electrode 68 defines an aperture 80 which is much larger than the aperture 78 in electrode 66, as will be discussed in more detail hereinafter.

The third electrode 70 is adapted to receive a fourth, accelerating, electrical potential which is positive relative to the potential applied to the second electrode 68. The third electrode 70 defines an aperture 82 which is substantially larger than the aperture 78 in the first electrode 66, but smaller than the aperture 80 in the second electrode 68.

The second, third and fourth electrical potentials applied to the electrodes 66, 68 and 70 are selected to establish beam-focusing fields between the first and second electrodes 66, 68 and between the second and third electrodes 68, 70.

The enclosure defined by the first electrode, the rings 44, 46 and 48 and the vacuum manifold comprise an ultra-high vacuum zone for maintaining the field emitter at an appropriate vacuum level—typically $10^{-9}$ to $10^{-10}$ torr. The restricted size of the aperture 78 in the first electrode is selected, in part, with consideration for maintaining the high vacuum in the zone containing the field emitter.

Because of the necessity of minimizing the magnification of the electron source formed by the field emitting tip 60, the magnification of the source at the storage medium 13 is preferably about 0.5–2.0. The objectives of system compactness and small probe sizes implies the use of relatively short object and image distances. As will become evident when the dimensions of the system are described below, these objectives leave insufficient room at the exit of the gun to use conventional beam deflection and stigmating systems.

The electron gun assembly 36 includes an integrated beam deflection and stigmating system following the principles of this invention. The beam deflection/stigmating system is illustrated as comprising magnetic field generating means for establishing plural fields of magnetic flux through the electrostatic lens for modifying the position and cross-sectional shape of the beam. As shown in FIGS. 2–3, the magnetic field generating means comprises a system of magnetic windings 84 configured on an electrically insulative cylindrical sleeve-like mandril 86 surrounding the lens assembly.

The windings 84 are configured to provide both X and Y beam deflection as well as quadrupolar beam stigmatizing. The manner in which the windings 84 are wound on the mandril 86 is shown in the FIGS. 4A–4D diagrams. The system of windings 84 includes X and Y beam deflection coils configured to create beam deflection fields for effecting static and/or dynamic deflection of the beam as it passes through the lens.

The system of windings 84 is also configured to create stigmating fields extending through the electrostatic lens and so defined as to correct cross-sectional asymmetries of the beam as it passes through the lens.

Figure 4A:
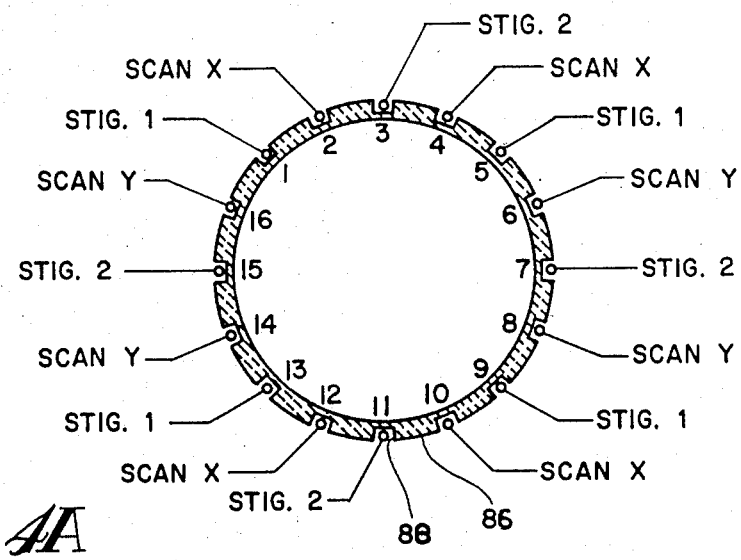
FIGS. 4A–4D are diagrams illustrating the manner in which integrated beam modifying coils are wound on a mandril constituting part of the FIGS. 2–3 gun.

FIG. 4A is a section view of the mandril 86 showing the stigmatizing and deflection windings positioned in the grooves 88 in the mandril 86. As shown in FIG. 4A, the sixteen grooves contain windings for both X and Y deflection as well as two quadrupolar stigmatizing coils—here labeled stig. 1 and stig. 2.

Figure 4B:
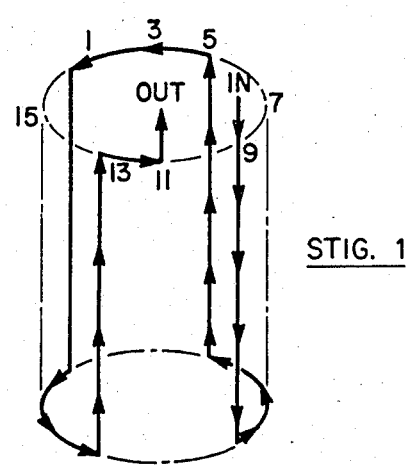
Figure 4C:
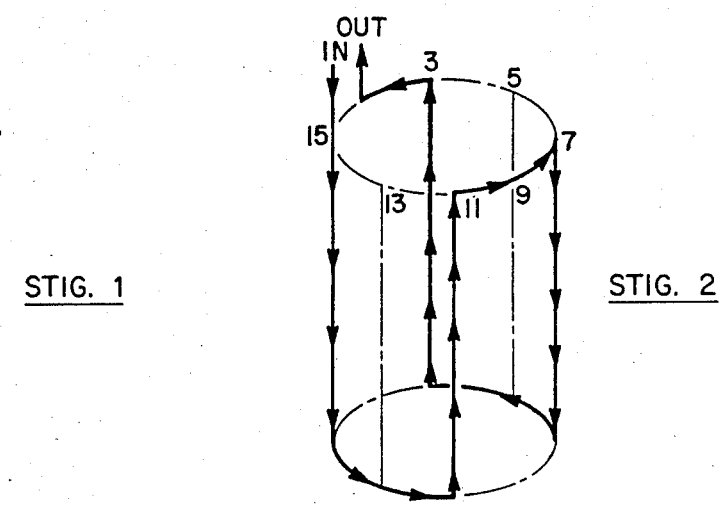
Figure 4D:
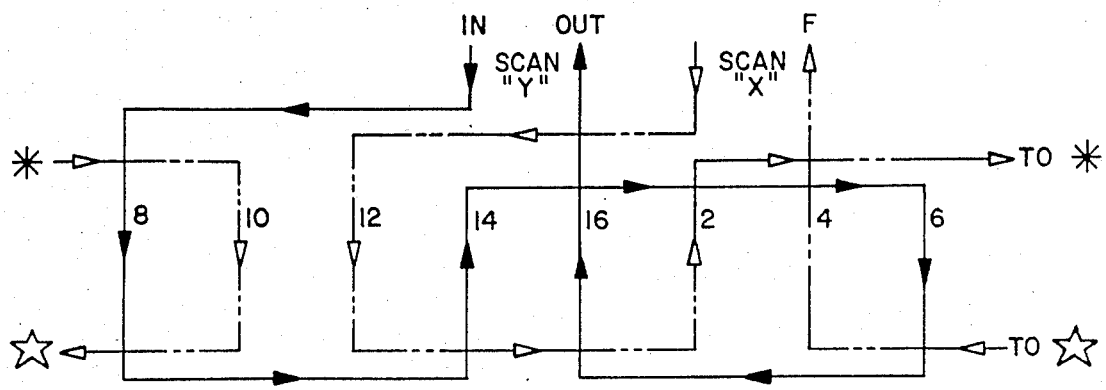

FIGS. 4B and 4C depict the placement of stigmating coils 1 and 2, respectively, in the grooves 88 in mandril 86. The deflection windings are shown in a rolled out portrayal in FIG. 4D for ease of understanding. The groove numbers in FIG. 4A correspond to those in FIGS. 4B, 4C and 4D.

Whereas the FIGS. 2–3 electron gun is shown as incorporating an integrated stigmating/deflection system according to this invention, the principles of the invention can be used in a general sense wherever it is desired to modify the characteristic of a beam passing through an electrostatic lens by the use of electromagnetic windings. In a general sense this invention may be thought of as including the provision in an electron gun having an electrostatic focus lens, magnetic field generating means adapted to receive static or dynamic control signals and characterized by comprising means positioned axially coincident with and surrounding the electrostatic lens to effectively immerse substantially the entire lens in the beam-modifying magnetic field. While this arrangement, due to the axial coincidence of the magnetic field-generating means with the lens, a characteristic of the beam may be modified without the magnetic field-generating means adding significantly, if at all, to the axial length of the gun.

Figure 5A:
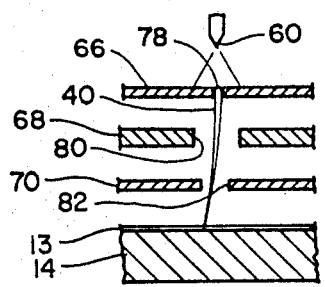
FIGS. 5A, 5B and 5C are diagrams showing the manner in which an electron beam is deflected using integrated deflection coils constituting part of the FIGS. 2-3 gun.
Figure 5B:
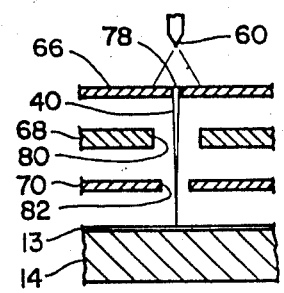
Figure 5C:
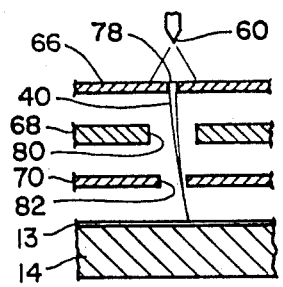

FIGS. 5A, 5B and 5C depict schematically the manner in which electron beam probe 40 is deflected within the electrostatic lens system itself to effect movement of the probe across the storage medium 13. It will be understood that in operation of the electron beam memory system, the heads 18, 19, 20 are moved across the disc to attain the gross positioning of electron beam during reading or writing operations. Fine positioning of the beam is achieved by use of the system of windings 84.

In order to better understand a manner in which deflection takes place in accordance with the teachings of this invention, it should be understood that the aperture 78 in the first electrode 66 is very small compared to apertures 80 and 82 in the second and third electrodes 68 and 70. By way of example, the aperture 78 may be only 6–20 microns radius compared with 1.2 millimeters for the aperture 80 and 0.4 millimeters for the aperture 82. It can be seen, then, that the aperture 78 causes the beam to have a relatively small diameter compared to the diameters of the apertures 80 and 82.

It should further be understood that in the particular application, it is only necessary to have a deflection capability of perhaps 10–20 microns—a distance sufficient to span perhaps 100 tracks on the storage medium 13—a deflection completely adequate for recording or for locating and/or following a particular track on the storage medium 13. It can readily be seen that movement of a beam having a radius of 6–20 microns in apertures having radii of 1200 and 400 microns will create no problem with interference between the beam and the electrodes 68, 70.

Whereas the invention is here depicted for effecting X and Y deflection and beam stigmating in an electron beam memory system, it has a wide variety of other applications. It could be used, for example, as a static beam positioner in any of a variety of electron beam devices. It could be used with other types of stigmating systems, or in an application where a scan is desired in one direction only. The invention would find readily utilization in electron beam devices other than electron beam memory systems wherein one or two dimensional scanning of a specimen, or a surface for writing or reading purposes, is desired. The invention could be used to wobbulate a beam in recording systems that use lateral beam deflection—in short, the invention is applicable for modifying various characteristics of an electron beam, particularly in applications where short axial length is desired.

The above embodiments are included merely as illustrative and it is contemplated that other structures may be devised to practice the teachings of the present invention. The following claims are intended to cover such other structures.

What is claimed is:

1. An electrostatic electron gun with integrated beam modifying means for use in electron beam systems, including electron beam memory systems, electron microscopes, electron lithographic devices, comprising:
    means forming a point source of electrons;
    means receiving electrons from said point source for defining an electron beam;
    electrostatic lens means receiving said beam and defining an axial field for forming a beam focus;
    integrated magnetic field-generating means for establishing a field of magnetic flux through said electrostatic lens means and transversely to said beam for modifying said beam or its position,
    said magnetic field generating means receiving static or dynamic control signals and comprising means positioned axially coincident with and surrounding said electrostatic lens means to effectively immerse substantially the entire lens means in said field of magnetic flux, wherein due to the axial coincidence of said magnetic field-generating means with said lens means, a beam characteristic is modified without said magnetic field-generating means adding significantly, if at all, to the axial length of the gun.

2. The apparatus defined by claim 1 wherein said magnetic field-generating means comprises magnetic coil means configured on an electrically insulative, cylindrical sleeve-like mandril surrounding said lens means.

3. The apparatus defined by claim 2 wherein said magnetic coil means are configured on said mandril to create beam deflection fields for effecting static or dynamic deflection of said beam as it passes through said lens means.

4. The apparatus defined by claim 2 wherein said magnetic coil means are configured on said sleeve to create stigmating fields for correcting cross-sectional asymmetries of said beam as it passes through said lens means.

5. An electrostatic electron gun with integrated beam deflection means for use in electron beam systems, including electron beam memory systems, electron microscopes, electron lithographic devices, comprising:
    means forming a high brightness point source of electrons;
    a first electrode receiving electrons from said point source and having an aperture therein for defining an electron beam;
    electrostatic lens means positioned to receive said beam for forming a beam focus, said lens means comprising at least first and second electrodes aligned on the axis of said beam for receiving different potentials effective to establish a beam focusing field therebetween, said first and second electrodes each having beam-passing apertures larger than the beam diameter as it passes therethrough; and
    integrated magnetic field-generating means for receiving electrical control signals and for establishing a static or dynamic magnetic deflection field through said electrostatic lens means, said magnetic field generating means comprising means positioned axially coincident with and surrounding said electrostatic lens means to effectively immerse substantially the entire lens means in a beam deflection field to cause, when the magnetic field strength is changed, the electron beam to move laterally relative to the beam axis within said first and second electrodes, wherein due to the axial coincidence of said magnetic field generating means with said electrostatic lens means, the beam is deflected through a range of beam positions without said generating means adding significantly, if at all, to the axial length of said gun.

6. The apparatus defined by claim 5 wherein said means for forming a high-brightness point source of electrons is a field emission cathode, and wherein said magnetic field generating means comprises an insulative sleeve-like mandril supporting a plurality of coils configured to produce said magnetic beam deflection fields through said lens means.

7. An electrostatic electron gun with integrated beam stigmating means for use in electron beam systems, including electron beam memory systems, electron microscopes, electron lithographic devices, comprising:
    means forming a high-brightness point source of electrons;
    a first electrode receiving electrons from said point source and having an aperture therein for defining an electron beam;
    electrostatic lens means positioned to receive said beam for forming a beam focus, said lens means comprising first and second electrodes aligned on the axis of said beam for receiving different potentials effective to establish a beam focusing field therebetween, said first and second electrodes each having beam passing apertures larger than the beam diameter as it passes therethrough; and
    integrated magnetic field generating means for receiving electrical control signals and for establishing a magnetic stigmating field through said electrostatic lens means, said magnetic field generating means comprising means positioned axially coincident with and surrounding the entire lens means in the beam stigmating field, wherein due to the axial coincidence of said magnetic field-generating means with said electrostatic lens means, the beam cross-sectional shape is adjusted without said generating means adding significantly, if at all, to the axial length of said gun.

8. The apparatus defined by claim 7 wherein said means forming said brightness source of electrons is a field emission cathode, and wherein said magnetic field generating means comprises an insulative sleeve-like mandril supporting a plurality of coils configured to produce said magnetic beam stigmating field.

9. For use in rapid random-accessed electron beam memory system having disc means mounted for rotation and supporting an information storage medium, and disc rotating means for rotating said disc, an electron gun with integrated beam-modifying means for moving the beam across said disc, said gun being capable of developing a finely focused electron beam probe and relatively high beam current densities, said gun comprising:
    means for forming a high-brightness electron point source;
    means for receiving electrons from said point source for defining an electron beam;

electrostatic focus lens means of low mass positioned a relatively short object distance from said point source for receiving said beam, said lens forming a finely focused, yet relatively intense electron beam probe at a relatively short focal distance therefrom; and integrated magnetic field generating means for establishing a field of magnetic flux through said electrostatic lens means for modifying said beam or its position, said magnetic field-generating means receiving static or dynamic control signals and characterized by comprising means positioned axially coincident with and surrounding said electrostatic lens means to effectively immerse substantially the entire lens means in the beam-modifying magnetic field, wherein due to the axial coincidence of said magnetic field-generating means with said lens means, a beam characteristic is modified without said magnetic field-generating means adding significantly to the axial length of the gun.

10. The apparatus defined by claim 9 wherein said magnetic field-generating means comprises magnetic coil means configured on an electrically insulative cylindrical sleeve-like mandril surrounding said lens means.

11. The apparatus defined by claim 10 wherein said magnetic coil means are configured on said mandril to create beam deflection fields for effecting static or dynamic deflection of said beam as it passes through said lens means.

12. The apparatus defined by claim 10 wherein said magnetic coil means are configured on said mandril to create stigmating fields for correcting cross-sectional asymmetries of said beam as it passes through said lens.

13. For use in a rapid random-accessed electron beam memory system having disc means mounted for rotation and supporting an information storage medium, and disc rotating means for rotating said disc, an electron gun with integrated beam-deflecting means for moving the beam across said disc to write or read a plurality of tracks thereon, said gun being capable of developing a finely focused electron beam probe and relatively high beam current densities, said gun comprising:

means for forming a high brightness electron point source;

a first electrode receiving electrons from said point source and having a relatively small aperture therein for defining an electron beam;

a second electrode aligned with said first electrode and having an aperture located to receive said beam, said second electrode aperture being significantly larger than the beam diameter as it passes therethrough; and integrated magnetic field generating means for receiving electrical control signals and for establishing dynamic magnetic deflection fields through said first and second electrodes for track selection and tracking, said magnetic field generating means comprising means positioned axially coincident with and surrounding said first and second electrodes to effectively immerse said electrodes in the beam deflection field to cause, when the magnetic field strength is changed, the electron beam to move laterally relative to the beam axis within said second electrode aperture, wherein due to the axial coincidence of said magnetic field generating means with said electrodes, the beam is deflected through a range of beam positions encompassing a plurality of said tracks without adding significantly, if at all, to the axial length of said gun.

14. The apparatus as defined by claim 13 wherein said magnetic field generating means comprises an insulative sleeve-like mandril supporting a plurality of coils configured to produce said magnetic beam deflection fields.

15. For use in a rapid random-accessed electron beam memory system having disc means mounted for rotation and supporting an information storage medium, and disc rotating means for rotating said disc, an electron gun with integrated beam-stigmating means for moving the beam across said disc, said gun being capable of developing a finely focused electron beam probe and relatively high beam current densities, said gun comprising:

means for forming a high brightness electron point source;

a first electrode receiving electrons from said point source and having a relatively small aperture therein for defining an electron beam;

a second electrode aligned with said first electrode and having an aperture located to receive said beam, said second electrode aperture being significantly larger than the beam diameter as it passes therethrough; and integrated magnetic field generating means for receiving electrostatic control signals and for establishing a stigmating magnetic field through said first and second electrodes for correcting cross-sectional asymmetries in the beam, said magnetic field generating means comprising means positioned axially coincident with and surrounding said first and second electrodes effectively immerse said electrodes in the beam stigmating field to cause, when the magnetic field is changed, the cross-sectional shape of the electron beam to change, wherein due to the axial coincidence of said magnetic field generating means with said electrodes, the beam cross-sectional shape is changed without adding significantly, if at all, to the axial length of said gun.

16. The apparatus as defined by claim 15 wherein said means for forming a high-brightness point source of electrons is a field emission cathode, and wherein said magnetic field generating means comprises an insulative sleeve supporting a plurality of coils configured to produce said magnetic beam stigmating fields through said electrodes.

17. For use in a rapid random-accessed electron beam memory system having disc means mounted for rotation and supporting an information storage medium, and disc rotating means for rotating said disc, an electron gun with integrated beam deflecting and stigmating means for moving the beam across said disc to write or read a plurality of tracks thereon, said gun being capable of developing a finely focused electron beam probe and relatively high beam current densities, said gun comprising:

a field emission cathode and means for heating said cathode, said cathode having an emitting tip for receiving an exciting potential to form a high-brightness electron point source;

electrostatic lens means positioned to receive said beam for forming a beam focus, said lens means comprising first, second and third electrodes aligned on the axis of said beam for receiving different potentials effective to establish a beam focusing field, said first electrode having a relatively small aperture for defining the diameter of the beam which is formed, said second and third electrodes each having beam passing apertures substantially larger than the beam diameter as it passes therethrough;

integrated magnetic field generating means for receiving electrical control signals and for establishing dynamic magnetic deflection fields and stigmating fields through said electrostatic lens means for track selection and tracking and beam stigmating, said magnetic field generating means comprising means positioned axially coincident with and surrounding said electrostatic lens means to effectively immerse substantially the entire electrostatic lens means in the beam deflection field to cause, when the magnetic deflection field strength is changed, the electron beam to move laterally relative to the beam axis within the apertures of said second and third electrodes and to cause, when the magnetic stigmating field strength is changed, the cross-sectional shape of the electron beam to change, wherein due to the axial coincidence of said magnetic field generating means with said electrostatic lens means, the beam is deflected through a range of beam positions encompassing a plurality of said tracks, and beam cross-sectional asymmetries are corrected, without adding significantly, if at all, to the axial length of said gun.

18. The apparatus as defined by claim 17 wherein said magnetic field generating means comprises an insulative sleeve-like mandril supporting a plurality of coils configured to produce said magnetic beam deflection and stigmating fields in said lens means.

* * * * *